United States Patent
Chen et al.

(10) Patent No.: US 10,729,032 B1
(45) Date of Patent: Jul. 28, 2020

(54) SLIDE RAIL ASSEMBLY

(71) Applicants: KING SLIDE WORKS CO., LTD., Kaohsiung (TW); KING SLIDE TECHNOLOGY CO., LTD., Kaohsiung (TW)

(72) Inventors: Ken-Ching Chen, Kaohsiung (TW); Shun-Ho Yang, Kaohsiung (TW); Chien-Li Huang, Kaohsiung (TW); Chun-Chiang Wang, Kaohsiung (TW)

(73) Assignees: KING SLIDE WORKS CO., LTD., Kaohsiung (TW); KING SLIDE TECHNOLOGY CO., LTD., Kaohsiung (TW)

( * ) Notice: Subject to any disclaimer, the term of this patent is extended or adjusted under 35 U.S.C. 154(b) by 0 days.

(21) Appl. No.: 16/656,564

(22) Filed: Oct. 17, 2019

(30) Foreign Application Priority Data

Jul. 31, 2019 (TW) .............................. 108127486 A

(51) Int. Cl.
*H05K 5/00* (2006.01)
*H05K 7/14* (2006.01)
*A47B 88/423* (2017.01)

(52) U.S. Cl.
CPC .......... *H05K 7/1489* (2013.01); *A47B 88/423* (2017.01)

(58) Field of Classification Search
CPC .................................................. H05K 7/1489
See application file for complete search history.

(56) References Cited

U.S. PATENT DOCUMENTS

| | | | |
|---|---|---|---|
| 6,834,923 B2 | 12/2004 | Young | |
| 8,240,790 B2 | 8/2012 | Zhang | |
| 9,155,386 B2 | 10/2015 | Hashemi | |
| 9,328,769 B1* | 5/2016 | Chen | H05K 7/1489 |
| 2017/0188705 A1* | 7/2017 | Chen | A47B 88/43 |
| 2017/0303426 A1 | 10/2017 | Chen | |

FOREIGN PATENT DOCUMENTS

CN 101803832 8/2010

* cited by examiner

*Primary Examiner* — Jerry Wu
(74) *Attorney, Agent, or Firm* — Winston Hsu

(57) ABSTRACT

A slide rail assembly includes a first rail, a bracket and a second rail. The bracket is arranged on the first rail. The second rail is movable relative to the first rail. The second rail includes a first wall, a second wall and a longitudinal wall connected between the first wall and the second wall of the second rail. A supporting portion is arranged on one of the first rail and the bracket. When the second rail is located at an extended position relative to the first rail, the supporting portion and the first wall of the second rail are able to support each other.

14 Claims, 8 Drawing Sheets

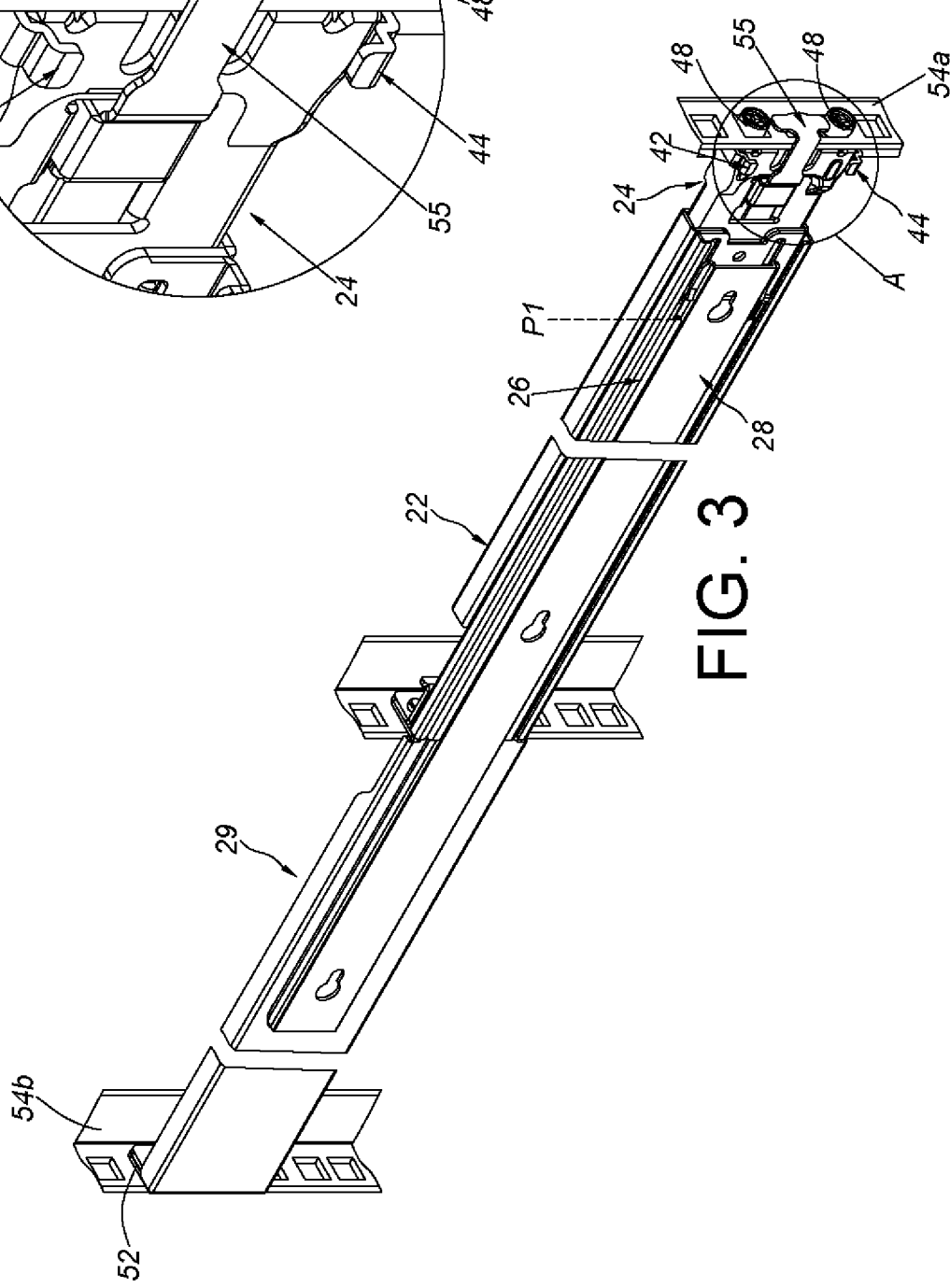

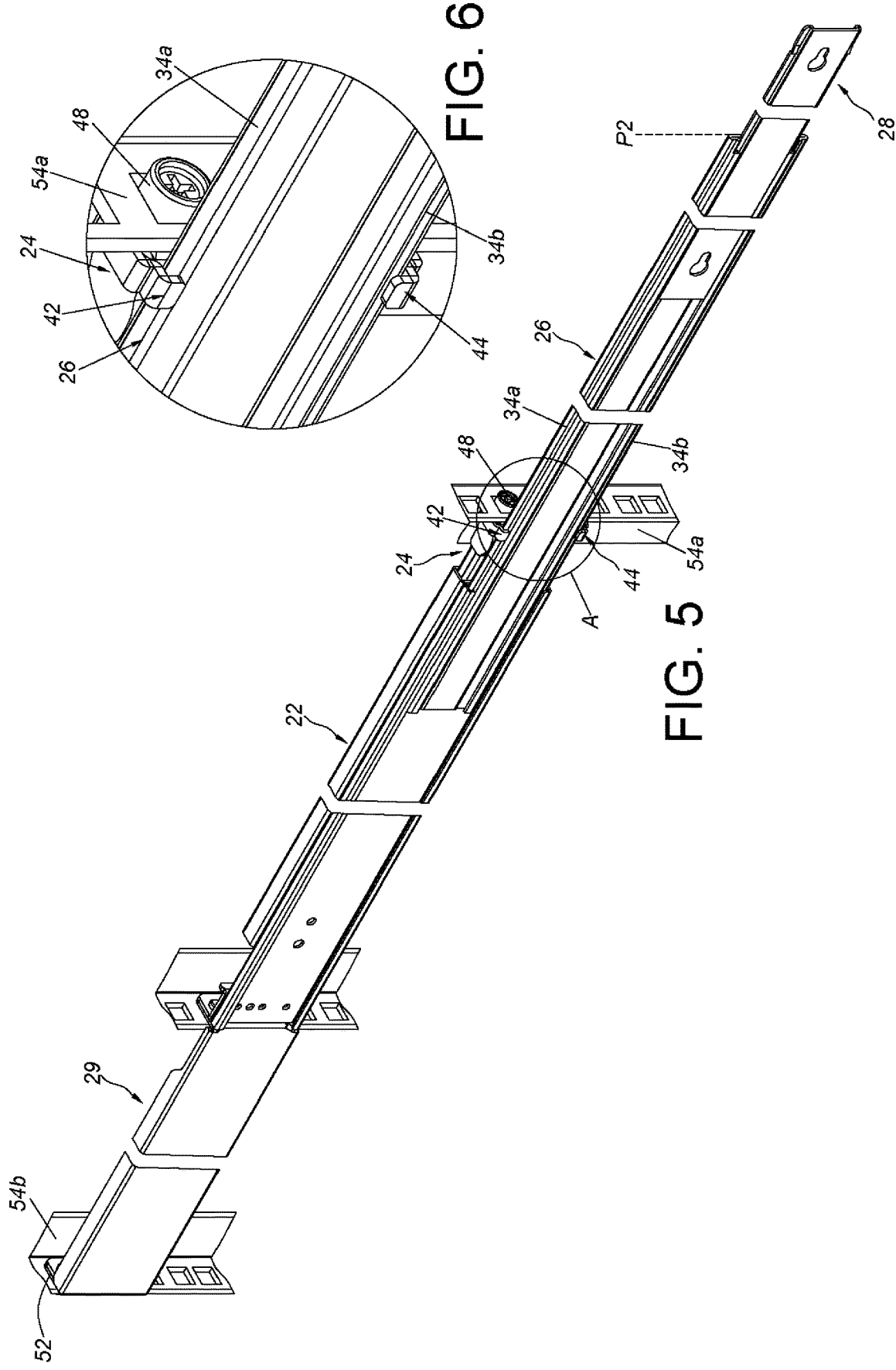

SLIDE RAIL ASSEMBLY

BACKGROUND OF THE INVENTION

1. Field of the Invention

The present invention relates to a slide rail assembly, and more particularly, to a slide rail assembly with improved structural strength.

2. Description of the Prior Art

China patent with publication Number CN 101803832A discloses a slide rail applicable to a server rack. The slide rail includes a first rail, a second rail and a third rail. Wherein, the patent does not disclose a bracket able to improve structural reliability of the slide rail assembly.

In addition, to improve structural strength of the third rail, a top portion and a bottom portion of the third rail of the patent are U-shaped folded (folded and piled structure). For corresponding to the U-shaped folded portions of the third rail, a transverse width of a concave structure of the second rail has to be arranged greater than a transverse width of a passage of the first rail. Therefore, the U-shaped folded portions of the third rail are not able to correspond to a range of the transverse width of the passage of the first rail. In this embodiment of the patent, an overall transverse width of the slide rail assembly is increased, which is a disadvantage for mounting a wide width server on the slide rail assembly.

Therefore, as different requirements of market, how to develop a different slide rail assembly has become an issue.

SUMMARY OF THE INVENTION

An object of the present invention is to provide a slide rail assembly having improved structural strength.

According to an embodiment of the present invention, A slide rail assembly includes a first rail, a first bracket and a second rail. The first bracket is arranged on the first rail. The second rail is movable relative to the first rail. Wherein, the second rail includes a first wall, a second wall and a longitudinal wall connected between the first wall and the second wall of the second rail. Wherein, a first supporting portion is arranged on one of the first rail and the first bracket. Wherein, when the second rail is located at an extended position relative to the first rail, the first supporting portion and the first wall of the second rail support each other.

Preferably, a second supporting portion is arranged on one of the first rail and the first bracket, when the second rail is located at the extended position relative to the first rail, the second supporting portion and the second wall of the second rail support each other.

Preferably, when the second rail is located at a retracted position relative to the first rail, the first supporting portion and the first wall of the second rail do not be engaged with each other.

Preferably, the first supporting portion is arranged on the first bracket.

Preferably, both of the first supporting portion and the second supporting portion are arranged on the first bracket.

Preferably, the first bracket is located adjacent to a first end portion of the first rail, the first bracket includes a side wall, when the second rail is located at the extended position relative to the first rail, the side wall of the first bracket and the longitudinal wall of the second rail support each other.

Preferably, the first rail includes a first wall, a second wall and a longitudinal wall connected between the first wall and the second wall of the first rail, a first passage is defined by the first wall, the second wall and the longitudinal wall of the first rail, the first passage is configured to accommodate the second rail, the second rail is movably mounted in the first passage.

Preferably, the slide rail assembly further comprising a third rail, wherein a second passage is defined by the first wall, the second wall and the longitudinal wall of the second rail, the second passage is configured to accommodate the third rail, the third rail is movably mounted in the second passage.

Preferably, the third rail includes a first wall, a second wall and a longitudinal wall connected between the first wall and the second wall of the third rail, at least one of the first wall and the second wall of the first rail includes a first wall section and a second wall section bent relative to the first wall section, a transverse width is form between the second wall section of the first rail and the longitudinal wall of the first rail, at least one of the first wall and the second wall of the third rail includes a first wall section bent relative to the longitudinal wall of the third rail and a second wall section bent relative to the first wall section of the third rail, the second wall section of the third rail extends into the second passage of the second rail, the second wall section of the third rail is located within the transverse width.

Preferably, at least one of the first wall and the second wall of the second rail includes a first extension section bent relative to the longitudinal wall of the second rail, a first bending section bent relative to the first extension section, a second extension section bent relative to the first bending section and a second bending section bent relative to the second extension section, the second extension section of the second rail and the first wall section of the third rail are able to support each other.

Preferably, the longitudinal wall of the second rail includes a first longitudinal section, a second longitudinal section and an intermediate section, the first longitudinal section and the second longitudinal section are respectively bent from two opposite ends of the intermediate section.

Preferably, the first supporting portion is configured to provide the first wall of the second rail with support in a transverse direction and/or in a height direction.

Preferably, a second supporting portion is arranged on one of the first rail and the first bracket, the second supporting portion is configured to provide the second wall of the second rail with support in a transverse direction and/or in a height direction.

Another object of the present invention is to provide a slide rail assembly having a narrower width to correspond a server having a wider width.

According to another embodiment of the present invention, a slide rail assembly includes a first rail, a second rail and a third rail. The first rail includes a first wall, a second wall and a longitudinal wall connected between the first wall and the second wall of the first rail. The second rail is movable relative to the first rail. Wherein, the second rail includes a first wall, a second wall and a longitudinal wall connected between the first wall and the second wall of the second rail. At least one of the first wall and the second wall of the second rail includes a first extension section laterally bent relative to the longitudinal wall of the second rail, a first bending section bently connected to the first extension section, a second extension section laterally bent relative to the first bending section and a second bending section bently connected to the second extension section. The third rail is movable relative to the second rail. Wherein, the third rail includes a first wall, a second wall and a longitudinal wall connected between the first wall and the second wall of the third rail. At least one of the first wall and the second wall of the third rail includes a first wall section laterally bent relative to the longitudinal wall of the third rail and a second wall section substantially perpendicularly connected to the first wall section of the third rail. Wherein, an end portion the second wall section of the third rail is located adjacent to the second extension section of the second rail.

According to yet another embodiment of the present invention, a slide rail assembly includes a first rail, a second rail and a third rail. The first rail includes a first wall, a second wall and a longitudinal wall connected between the first wall and the second wall of the first rail. The second rail is movable relative to the first rail. Wherein, the second rail includes a first wall, a second wall and a longitudinal wall connected between the first wall and the second wall of the second rail. The third rail is movable relative to the second rail. Wherein, the third rail includes a first wall, a second wall and a longitudinal wall connected between the first wall and the second wall of the second rail. Wherein, a first passage is defined by the first wall, the second wall and the longitudinal wall of the first rail. The first passage is configured to accommodate the second rail. The second rail is movably mounted in the first passage. A second passage is defined by the first wall, the second wall and the longitudinal wall of the second rail. The second passage is configured to accommodate the third rail. The third rail is movably mounted in the second passage. Wherein, at least one of the first wall and the second wall of the first rail includes a first wall section and a second wall section bent relative to the first wall section. A transverse width is form between the second wall section of the first rail and the longitudinal wall of the first rail. At least one of the first wall and the second wall of the third rail includes a first wall section bent relative to the longitudinal wall of the third rail and a second wall section bent relative to the first wall section of the third rail. The second wall section of the third rail extends into the second passage of the second rail. The second wall section of the third rail is located within the transverse width.

Preferably, the longitudinal wall of the third rail and the second wall sections of the first rail are substantially on a same plane.

Preferably, at least one of the first wall and the second wall of the second rail includes a first extension section bent relative to the longitudinal wall of the second rail, a first bending section bent relative to the first extension section, a second extension section bent relative to the first bending section and a second bending section bent relative to the second extension section, the second extension section of the second rail and the first wall section of the third rail are able to support each other.

Preferably, the longitudinal wall of the second rail includes a first longitudinal section, a second longitudinal section and an intermediate section, the first longitudinal section and the second longitudinal section are respectively bent from two opposite ends of the intermediate section.

Preferably, the slide rail assembly further includes a first bracket arranged on the first rail, one of the first bracket and the first rail includes a first supporting portion, the first supporting portion is configured to provide at least one support of the first wall of the second rail in a transverse direction.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 3 is a diagram illustrating the slide rail assembly being mounted on a rack through a bracket and the slide rail assembly being retracted according to the first embodiment of the present invention.

FIG. 4 is an enlarge view of an area A of FIG. 3.

FIG. 5 is a diagram illustrating the slide rail assembly being mounted on a rack through a bracket and the slide rail assembly being extended according to the first embodiment of the present invention.

FIG. 6 is an enlarge view of an area A of FIG. 5.

DETAILED DESCRIPTION

Figure 1:
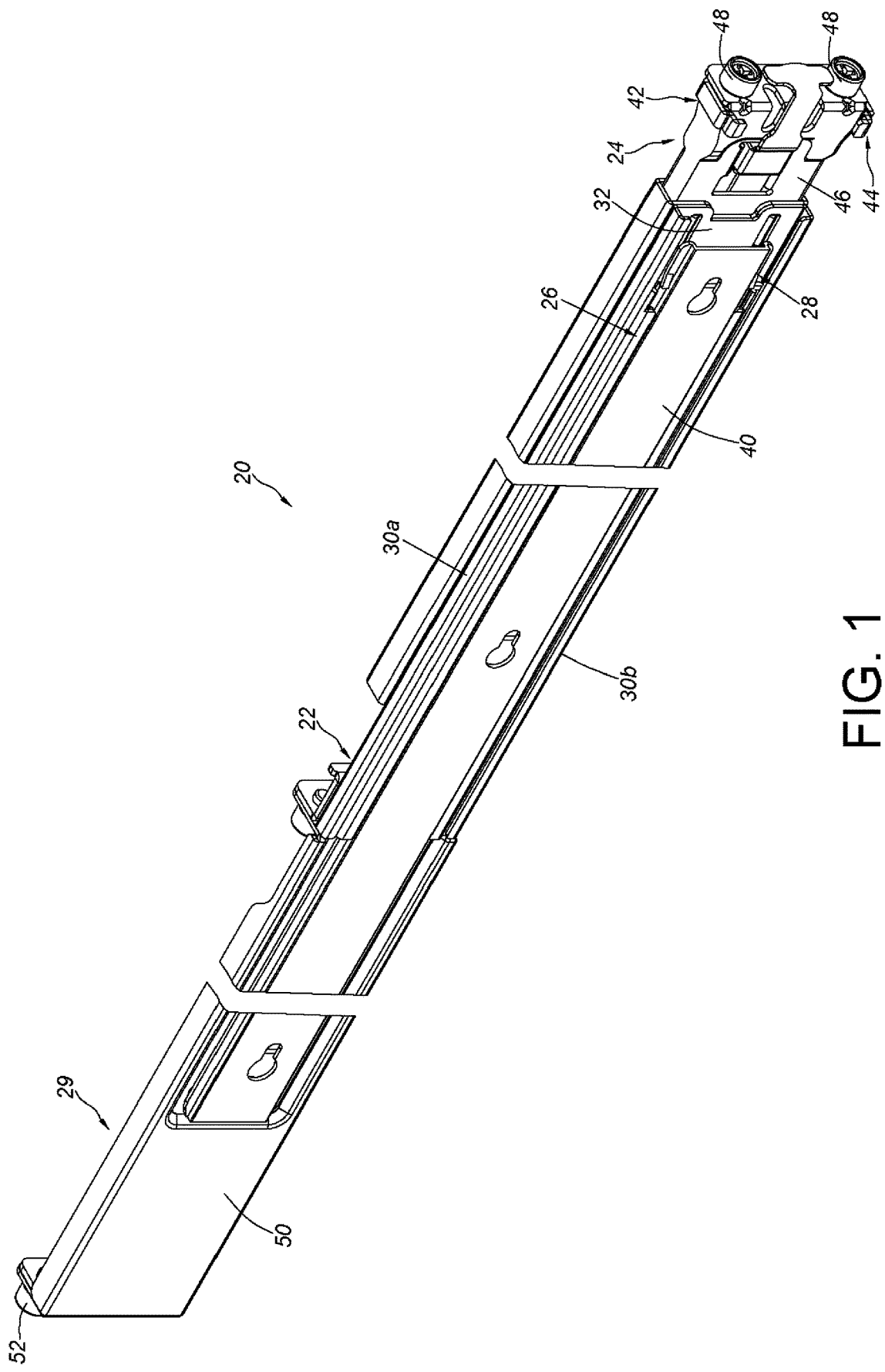
FIG. 1 is a schematic diagram illustrating a slide rail assembly according to a first embodiment of the present invention.
Figure 2:
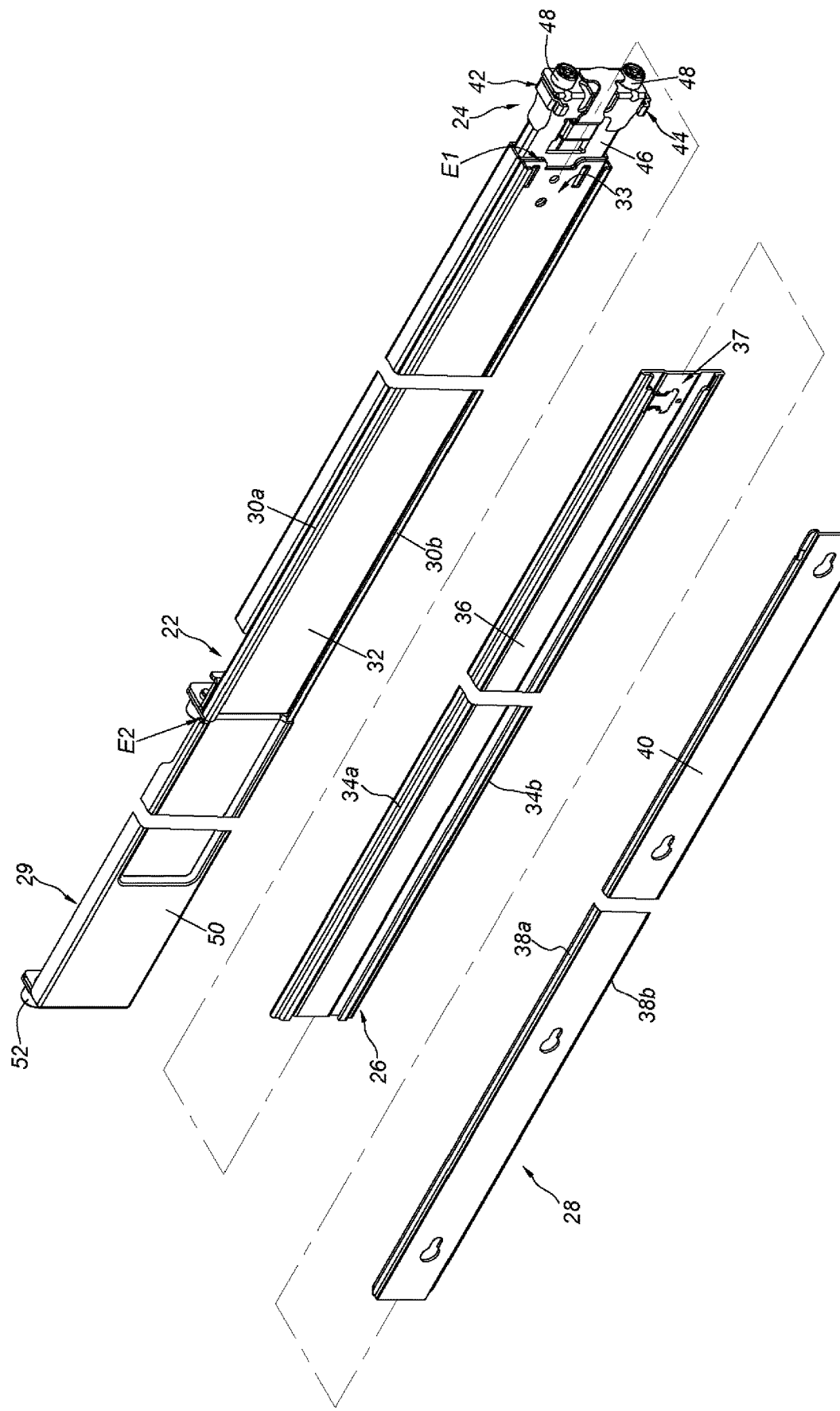
FIG. 2 is an exploded view illustrating the slide rail assembly according to the first embodiment of the present invention.

As shown in FIG. 1 and FIG. 2, a slide rail assembly 20 according to a first embodiment of the present invention includes a first rail 22, a first bracket 24 and a second rail 26. Preferably, the slide rail assembly 20 further includes a third rail 28 and a second bracket 29.

The first rail 22 includes a first wall 30a, a second wall 30b and a longitudinal wall 32 connected between the first wall 30a and the second wall 30b of the first rail 22. A first passage 33 is defined by the first wall 30a, the second wall 30b and the longitudinal wall 32 of the first rail 22. The second rail 26 is movably mounted in the first passage 33. The first rail 22 has a first end portion E1 and a second end portion E2 far from the first end portion E1 of the first rail 22. In the present embodiment, he first end portion E1 and the second end portion E2 are respectively a front end portion and a rear end portion of the first rail 22, but the present invention is not limited thereto.

The first bracket 24 is arranged on the first rail 22. Preferably, the first bracket 24 is located adjacent to the first end portion E1 of the first rail 22.

The second rail 26 is movable longitudinally relative to the first rail 22. The second rail 26 includes a first wall 34a, a second wall 34b and a longitudinal wall 36 connected between the first wall 34a and the second wall 34b of the second rail 26. A second passage 37 is defined by the first wall 34a, the second wall 34b and the longitudinal wall 36 of the second rail 26. The third rail 28 is movably mounted in the second passage 37.

The third rail 28 is movable longitudinally relative to the second rail 26. The third rail 28 includes a first wall 38a, a second wall 38b and a longitudinal wall 40 connected between the first wall 38a and the second wall 38b of the third rail 28.

The second bracket 29 is arranged adjacent to the second end portion E2 of the first rail 22.

Wherein, a first supporting portion 42 and a second supporting portion 44 are arranged on one of the first rail 22 and the first bracket 24. In the present embodiment, the first supporting portion 42 and the second supporting portion 44 are both arranged on the first bracket 24, and the first supporting portion 42 and the second supporting portion 44 are integrated on the first bracket 24, but the present invention is not limited thereto.

Preferably, the first bracket 24 includes a side wall 46 and at least one first mounting member 48 adjacent to the side wall 46. On the other hand, the second bracket 29 includes a side plate 50 and at least one second mounting member 52 adjacent to the side plate 50.

As shown in FIG. 3 and FIG. 4, the at least one first mounting member 48 of the first bracket 24 is configured to mount the first rail 22 to a first post 54a of a rack (or a cabinet body). The at least one second mounting member 52 of the second bracket 29 is configured to mount the first rail 22 to a second post 54b. Preferably, a fastening member 55 is movably mounted on the first bracket 24, and configured to fasten the first post 54a.

Furthermore, when the second rail 26 is located at a retracted position P1 relative to the first rail 22, the first supporting portion 42 and the first wall 34a of the second rail 26 do not support each other, and the second supporting portion 44 and the second wall 34b of the second rail 26 do not support each other.

Figure 7:
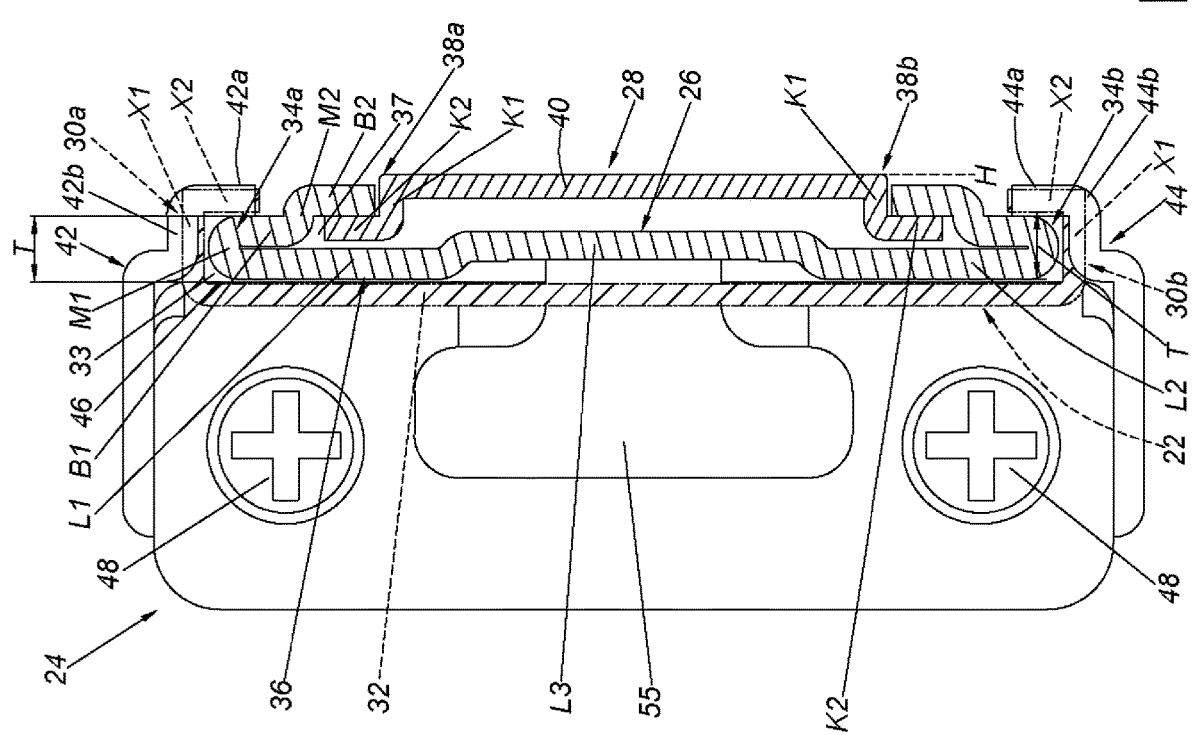
FIG. 7 is a cross-sectional view illustrating the slide rail assembly according to the first embodiment of the present invention.

As shown in FIG. 5, FIG. 6 and FIG. 7, when the second rail 26 is longitudinally moved along an opening direction relative the first rail 22 from the retracted position P1 to an extended position P2, the first supporting portion 42 and the first wall 34a of the second rail 26 are able to support each other. Preferably, the second supporting portion 44 and the second wall 34b of the second rail 26 are able to support each other, and the side wall 46 of the first bracket 24 and the longitudinal wall 36 of the second rail 26 are able to support each other. It should be noticed that the first bracket 24 including both of the first supporting portion 42 and the second supporting portion 44 is illustrative of an embodiment. In another embodiment, the first bracket 24 includes the first supporting portion 42 only, and the first supporting portion 42 is corresponding to the first wall 34a of the second rail 26. In yet another embodiment, the first bracket 24 includes the second supporting portion 44 only, and the second supporting portion 44 is corresponding to the second wall 34b of the second rail 26. In other words, structures of the first bracket 24 including at least one supporting portion, i.e., structures of the first bracket 24 including the first supporting portion 42 and/or the second supporting portion 44, are within the scope of the present invention.

Preferably, at least one of the first wall 30a and the second wall 30b of the first rail 22 includes a first wall section X1 and a second wall section X2 bent relative to the first wall section X1. In the present embodiment, both of the first wall 30a and the second wall 30b of the first rail 22 include the first wall section X1 and the second wall section X2. A transverse width T is form between each one of the second wall sections X2 of the first rail 22 and the longitudinal wall 32 of the first rail 22 (as shown in FIG. 7). On the other hand, at least one of the first wall 38a and the second wall 38b of the third rail 28 includes a first wall section K1 laterally bent relative to the longitudinal wall 40 of the third rail 28 and a second wall section K2 substantially perpendicularly connected to the first wall section K1 of the third rail 28. In the present embodiment, both of the first wall 38a and the second wall 38b of the third rail 28 include the first wall section K1 and a second wall section K2. Wherein, each one of the second wall sections K2 of the third rail 28 extends into the second passage 37 of the second rail 26, and each one of the second wall sections K2 of the third rail 28 is located correspondingly within the transverse width T of the first rail 22 (such as being located between each one of the second wall sections X2 and the longitudinal wall 32 of the first rail 22). In addition, the longitudinal wall 40 of the third rail 28 is located on a plane H, and the plane H is slightly protruded relative to each one of the second wall sections X2 of the first rail 22 by a short distance. Therefore, the longitudinal wall 40 of the third rail 28 and each one of the second wall sections X2 of the first rail 22 can be regarded as on the same plane H substantially. According to above structural features, an overall width of the slide rail assembly is able to be reduced, such that the slide rail assembly can be narrower.

Preferably, at least one of the first wall 34a and the second wall 34b of the second rail 26 includes a first extension section M1 laterally bent relative to the longitudinal wall 36 of the second rail 26, a first bending section B1 bently connected to the first extension section M1, a second extension section M2 laterally bent relative to the first bending section B1 and a second bending section B2 bently connected to the second extension section M2. In the present embodiment, both of the first wall 34a and the second wall 34b of the second rail 26 includes the first extension section M1, the first bending section B1, the second extension section M2 and the second bending section B2. Wherein, structures of the first extension section M1, the first bending section B1, the second extension section M2 and the second bending section B2 are continually bent. Therefore, the structural strength of the second rail 26 is improved, in order to further improve the overall structural strength of the slide rail assembly. In addition, the second bending section B2 of the second rail 26 and the first wall section K1 of the third rail 28 are able to support each other, to further improve the structural strength of the second rail 26 and the third rail 28.

Preferably, an end portion of the second wall section K2 of the third rail 28 is adjacent to the second extension section M2 of the second rail 26.

Preferably, the longitudinal wall 36 of the second rail 26 includes a first longitudinal section L1, a second longitudinal section L2 and an intermediate section L3. The first longitudinal section L1 and the second longitudinal section L2 are respectively bent from two opposite ends of the intermediate section L3, such that structural strength of the connection of the two opposite ends of the intermediate section L3 and the first longitudinal section L1 and the second longitudinal section L2 is also improved.

Preferably, the first supporting portion 42 includes a first supporting section 42a configured to support the first wall 34a of the second rail 26. For example, the first supporting section 42a is configured to support the first wall 34a of the second rail 26 in a transverse direction (in other words, the first supporting section 42a supports a lateral side of the first wall 34a of the second rail 26). For corresponding to the side wall 46 of the first bracket 24, the first wall 34a of the second rail 26 is located between the first supporting section 42a and the side wall 46 of the first bracket 24, to prevent the second rail 26 from being moved in the transverse direction (such as to prevent the second rail 26 from being moved to left or to right in FIG. 7, but the present invention is specifically not limited thereto). Preferably, the first supporting portion 42 further includes another first supporting section 42b configured to support the first wall 34a of the second rail 26 in a height direction (such as to prevent an upper portion of the second rail 26 from being moved). Wherein, the transverse direction and the height direction are substantially perpendicular relative to each other.

Similarly, the second supporting portion 44 includes a second supporting section 44a configured to support the second wall 34b of the second rail 26. For example, the second supporting section 44a is configured to support the second wall 34b of the second rail 26 in the transverse direction (in other words, the second supporting section 44a supports a lateral side of the second wall 34b of the second rail 26). For corresponding the side wall 46 of the first bracket 24, the second wall 34b of the second rail 26 is located between the second supporting section 44a and the side wall 46 of the first bracket 24, to prevent the second rail 26 from being moved in the transverse direction (such as to prevent the second rail 26 from being moved to left or to right in FIG. 7, but the present invention is specifically not limited thereto). Preferably, the second supporting portion 44 further includes another first supporting section 44b configured to support the second wall 34b of the second rail 26 in the height direction (such as to prevent a lower portion of the second rail 26 from being moved).

Figure 8:
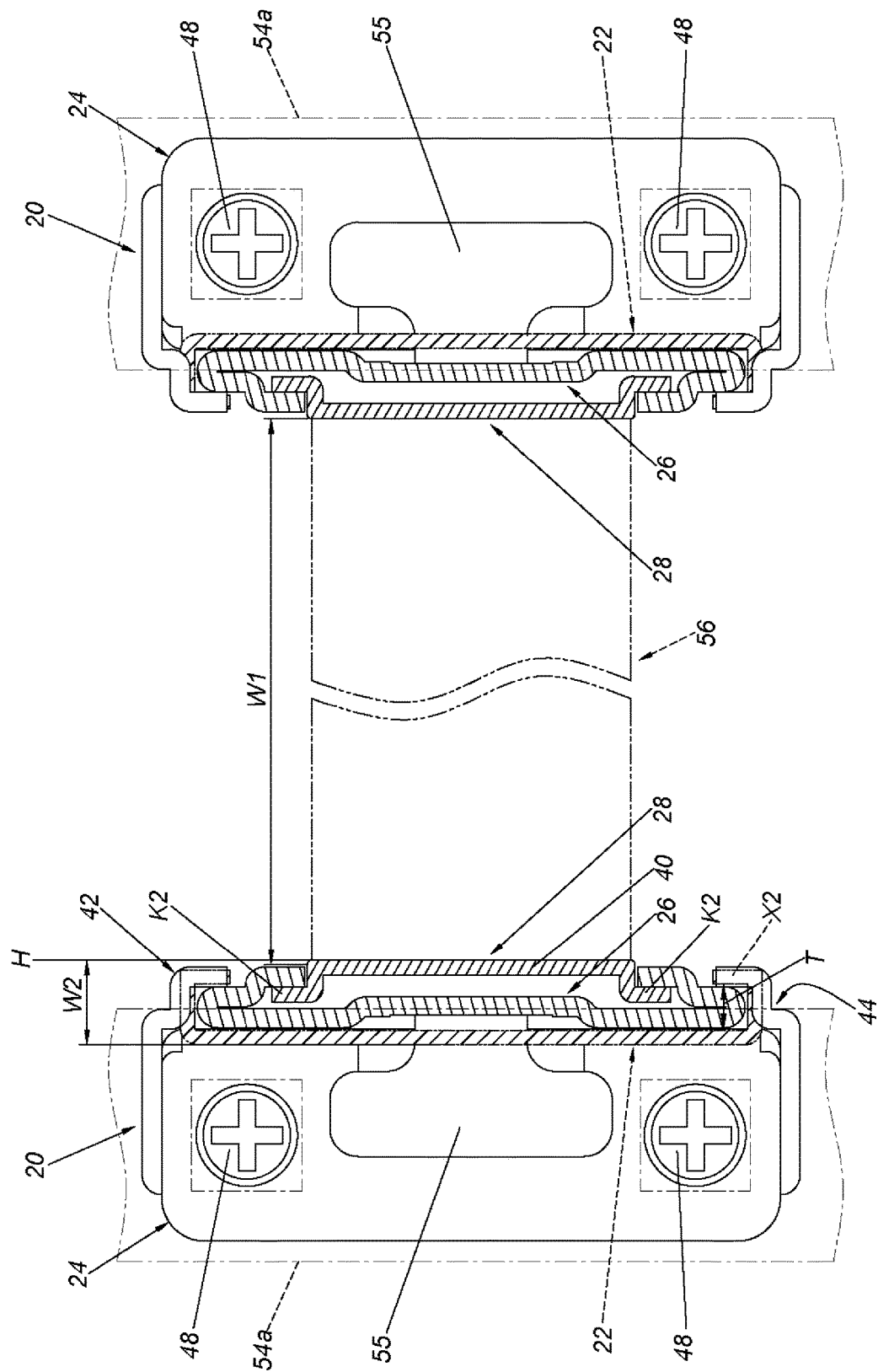
FIG. 8 is a cross-sectional view illustrating the slide rail assembly being mounted to the rack according to the first embodiment of the present invention.

As shown in FIG. 8, two sides of a carried object 56 (e.g. an electronic apparatus or a drawer) are mounted to the rack through two the slide rail assemblies 20. Wherein, the structural arrangement of the slide rail assembly 20 is illustrated in FIG. 1 to FIG. 7. For simplification, no further illustration is provided. Furthermore, each one of the slide rail assemblies 20 is mounted to a first post 54a through the first bracket 24.

It is noticed that there are standard specifications for the distance between the two first posts 54a of the rack and the width of the carried object 56. In other words, if the carried object width W1 of the carried object 56 is greater, the slide rail assembly 20 has to be thinner or narrower. Alternatively, if the carried object width W1 of the carried object 56 is smaller, the slide rail assembly 20 has to be wider or thicker. As such, the carried object 56 is able to be correspondingly mounted between the two first posts 54a of the rack through the slide rail assemblies 20.

Furthermore, according to the first embodiment of the present invention, since each one of the second wall sections K2 of the third rail 28 of the slide rail assembly 20 is correspondingly located within the transverse width T of the first rail 22, and/or the longitudinal wall 40 of the third rail 28 and each one of the second wall sections X2 of the first rail 22 are substantially on the same plane H (please refer to FIG. 7), such that an overall width W2 of the slide rail assembly 20 is reduced. As such, the carried object 56 which has the greater carried object width W1 is able to be mounted on the slide rail assembly 20.

Figure 9:
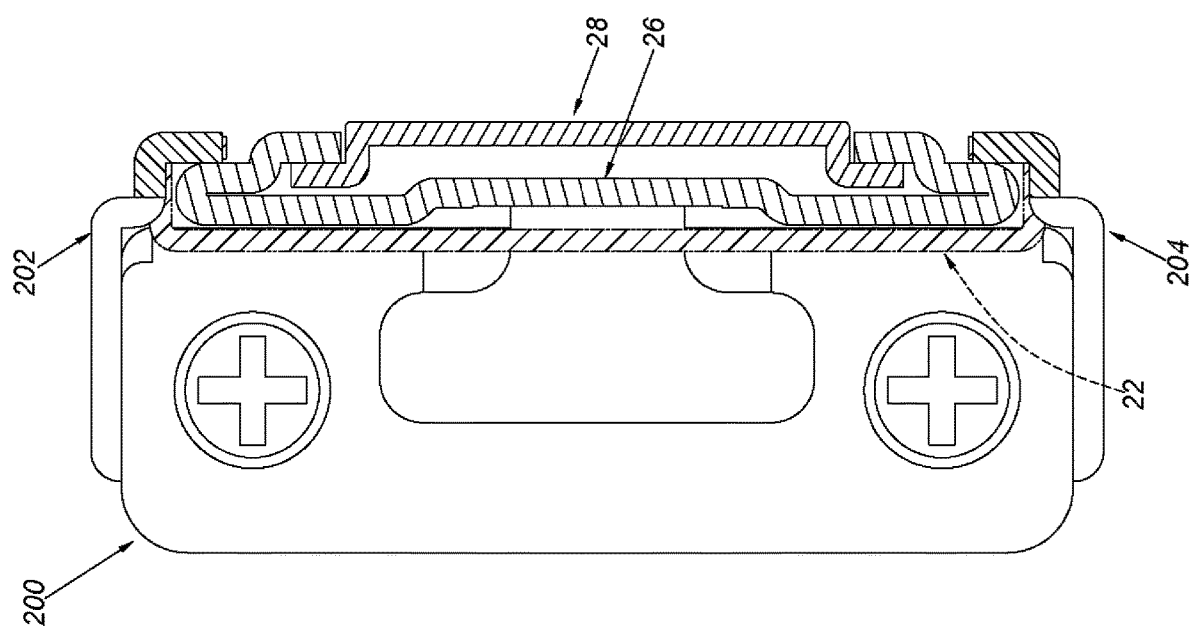
FIG. 9 is a cross-sectional view illustrating a slide rail assembly according to a second embodiment of the present invention.

As shown in FIG. 9, FIG. 9 is a diagram illustrating a slide rail assembly according to a second embodiment of the present invention. Moreover, the first supporting portion 42 and the second supporting portion 44 of the slide rail assembly of the first embodiment are integrated on the first bracket 24. Difference between the second embodiment and the first embodiment is that: a first supporting portion 202 and a second supporting portion 204 are two extra parts mounted on a first bracket 200. In other words, the first supporting portion 202, the second supporting portion 204 and the first bracket 200 are three independent components, and the first supporting portion 202 and the second supporting portion 204 are able to be integrated in the first bracket 200, i.e., by riveting.

Figure 10:
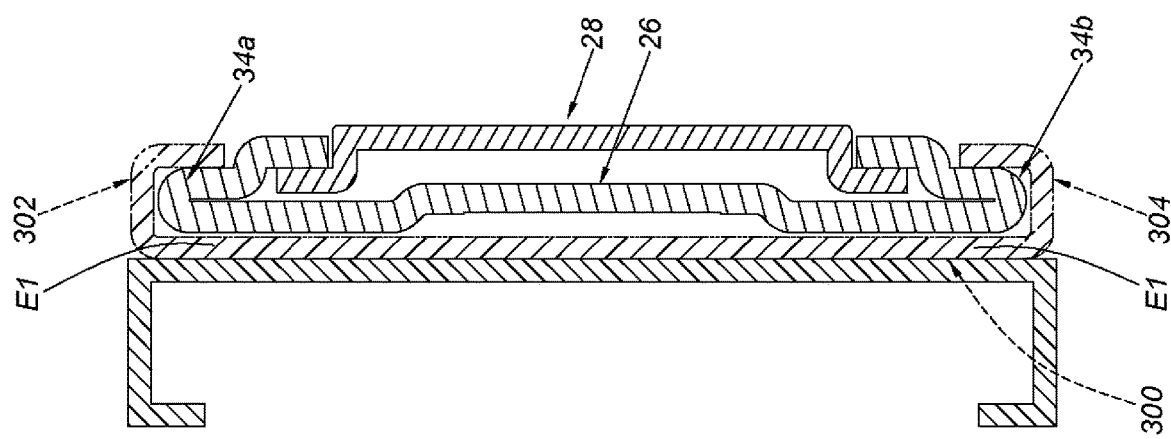
FIG. 10 is a cross-sectional view illustrating a slide rail assembly according to a third embodiment of the present invention.

As shown in FIG. 10, FIG. 10 is a diagram illustrating a slide rail assembly according to a third embodiment of the present invention. Moreover, the first supporting portion 42 and the second supporting portion 44 of the slide rail assembly of the first embodiment are integrated on the first bracket 24. Difference between the third embodiment and the first embodiment is that: a first supporting portion 302 and a second supporting portion 304 are arranged on the first rail 300.

Furthermore, the first supporting portion 302 and the second supporting portion 304 are two extended arms laterally extended from the first wall 30a and the second wall 30b of the first rail 22. According to the above arrangement, when the second rail 26 is located at the extended position P2 relative to the first rail 300, the first supporting portion 302 and the first wall 34a of the second rail 26 support each other, and the second supporting portion 304 and the second wall 34b of the second rail 26 support each other.

Compared to the prior art, the slide rail assembly according to all embodiments of the present invention have advantages over the prior art by the following perspectives:

1. When the second rail 26 is moved relative to the first rail 22 from the retracted position P1 along an opening direction to the extended position P2, the first supporting portion 42 and the first wall 34a of the second rail 26 support each other. Preferably, the second supporting portion 44 and the second wall 34b of the second rail 26 support each other, and the side wall 46 of the first bracket 24 and the longitudinal wall 36 of the second rail 26 support each other.

2. Each one of the second wall sections K2 of the third rail 28 is correspondingly located within the transverse width T of the first rail 22 (such as being located between of the second wall sections X2 and the longitudinal wall 32 of the first rail 22). In addition, the longitudinal wall 40 of the third rail 28 and each one of the second wall sections X2 of the first rail 22 are substantially on the same plane H. According to the above arrangement, the overall width of the slide rail assembly can be reduced.

3. Structures of the first extension section M1, the first bending section B1, the second extension section M2 and the second bending section B2 are continually bent. Therefore, the structural strength of the second rail 26 is improved, in order to further improve the overall structural strength of the slide rail assembly.

4. The second bending section B2 of the second rail 26 and the first wall section K1 of the third rail 28 are able to support each other, in order to further improve the supporting strength between the second rail 26 and the third rail 28.

5. The first longitudinal section L1 and the second longitudinal section L2 are respectively bent from two ends of the intermediate section L3, such that the structural strength of the connection of the two ends of the intermediate section L3 and the first longitudinal section L1 and the second longitudinal section L2 is also improved.

6. The first supporting portion 42 is configured to provide at least one support of the first wall 34a of the second rail 26 in the transverse direction and/or support of the first wall 34a of the second rail 26 in the height direction. Preferably, the second supporting portion 44 is configured to provide at least one support of the second wall 34b of the second rail 26 in the transverse direction and/or support of the second wall 34b of the second rail 26 in the height direction.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A slide rail assembly, comprising: a first rail; a first bracket arranged on the first rail; and a second rail movable relative to the first rail, wherein the second rail comprises a first wall, a second wall and a longitudinal wall connected between the first wall and the second wall of the second rail; wherein a first supporting portion is arranged on one of the first rail and the first bracket; wherein when the second rail is located at an extended position relative to the first rail, the first supporting portion and the first wall of the second rail support each other; and the longitudinal wall of the second rail comprises a first longitudinal section, a second longitudinal section and an intermediate section, the first longitudinal section and the second longitudinal section are respectively bent from two opposite ends of the intermediate section; a second supporting portion is arranged on one of the first rail and the first bracket, when the second rail is located at the extended position relative to the first rail, the second supporting portion and the second wall of the second rail support each other; and the first rail comprises a first wall, a second wall and a longitudinal wall connected between the first wall and the second wall of the first rail, a first passage is defined by the first wall, the second wall and the longitudinal wall of the first rail, the first passage is configured to accommodate the second rail, the second rail is movably mounted in the first passage; a third rail, wherein a second passage is defined by the first wall, the second wall and the longitudinal wall of the second rail, the second passage is configured to accommodate the third rail, the third rail is movably mounted in the second passage; and the third rail comprises a first wall, a second wall and a longitudinal wall connected between the first wall and the second wall of the third rail, at least one of the first wall and the second wall of the first rail comprises a first wall section and a second wall section bent relative to the first wall section, a transverse width is form between the second wall section of the first rail and the longitudinal wall of the first rail, at least one of the first wall and the second wall of the third rail comprises a first wall section bent relative to the longitudinal wall of the third rail and a second wall section bent relative to the first wall section of the third rail, the second wall section of the third rail extends into the second passage of the second rail, the second wall section of the third rail is located within the transverse width.

2. The slide rail assembly of claim 1, wherein when the second rail is located at a retracted position relative to the first rail, the first supporting portion and the first wall of the second rail do not be engaged with each other.

3. The slide rail assembly of claim 1, wherein the first supporting portion is arranged on the first bracket.

4. The slide rail assembly of claim 1, wherein both of the first supporting portion and the second supporting portion are arranged on the first bracket.

5. The slide rail assembly of claim 4, wherein the first bracket is located adjacent to a first end portion of the first rail, the first bracket comprises a side wall, when the second rail is located at the extended position relative to the first rail, the side wall of the first bracket and the longitudinal wall of the second rail support each other.

6. The slide rail assembly of claim 1, wherein the longitudinal wall of the third rail and the second wall sections of the first rail are substantially on a same plane.

7. The slide rail assembly of claim 1, wherein at least one of the first wall and the second wall of the second rail comprises a first extension section bent relative to the longitudinal wall of the second rail, a first bending section bent relative to the first extension section, a second extension section bent relative to the first bending section and a second bending section bent relative to the second extension section, the second extension section of the second rail and the first wall section of the third rail are able to support each other.

8. The slide rail assembly of claim 1, wherein the first supporting portion is configured to provide the first wall of the second rail with support in a transverse direction and/or in a height direction.

9. The slide rail assembly of claim 8, wherein a second supporting portion is arranged on one of the first rail and the first bracket, the second supporting portion is configured to provide the second wall of the second rail with support in a transverse direction and/or in a height direction.

10. A slide rail assembly, comprising: a first rail comprising a first wall, a second wall and a longitudinal wall connected between the first wall and the second wall of the first rail; a second rail movable relative to the first rail, wherein the second rail comprises a first wall, a second wall and a longitudinal wall connected between the first wall and the second wall of the second rail, at least one of the first wall and the second wall of the second rail comprises a first extension section laterally bent relative to the longitudinal wall of the second rail, a first bending section bently connected to the first extension section, a second extension section laterally bent relative to the first bending section and a second bending section bently connected to the second extension section; a third rail movable relative to the second rail, wherein the third rail comprises a first wall, a second wall and a longitudinal wall connected between the first wall and the second wall of the third rail, at least one of the first wall and the second wall of the third rail comprises a first wall section laterally bent relative to the longitudinal wall of the third rail and a second wall section substantially perpendicularly connected to the first wall section of the third rail; wherein an end portion the second wall section of the third rail is located adjacent to the second extension section of the second rail; the longitudinal wall of the second rail comprises a first longitudinal section, a second longitudinal section and an intermediate section, the first longitudinal section and the second longitudinal section are respectively bent from two opposite ends of the intermediate section.

11. A slide rail assembly, comprising: a first rail comprising a first wall, a second wall and a longitudinal wall connected between the first wall and the second wall of the first rail; a second rail movable relative to the first rail, wherein the second rail comprises a first wall, a second wall and a longitudinal wall connected between the first wall and the second wall of the second rail; and a third rail movable relative to the second rail, wherein the third rail comprises a first wall, a second wall and a longitudinal wall connected between the first wall and the second wall of the second rail; wherein a first passage is defined by the first wall, the second wall and the longitudinal wall of the first rail, the first passage is configured to accommodate the second rail, the second rail is movably mounted in the first passage, a second passage is defined by the first wall, the second wall and the longitudinal wall of the second rail, the second passage is configured to accommodate the third rail, the third rail is movably mounted in the second passage; wherein at least one of the first wall and the second wall of the first rail comprises a first wall section and a second wall section bent relative to the first wall section, a transverse width is form between the second wall section of the first rail and the longitudinal wall of the first rail, at least one of the first wall and the second wall of the third rail comprises a first wall section bent relative to the longitudinal wall of the third rail and a second wall section bent relative to the first wall section of the third rail, the second wall section of the third rail extends into the second passage of the second rail, the second wall section of the third rail is located within the transverse width; the longitudinal wall of the second rail comprises a first longitudinal section, a second longitudinal section and an intermediate section, the first longitudinal section and the second longitudinal section are respectively bent from two opposite ends of the intermediate section.

12. The slide rail assembly of claim 11, wherein the longitudinal wall of the third rail and the second wall sections of the first rail are substantially on a same plane.

13. The slide rail assembly of claim 11, wherein at least one of the first wall and the second wall of the second rail comprises a first extension section bent relative to the longitudinal wall of the second rail, a first bending section bent relative to the first extension section, a second extension section bent relative to the first bending section and a second bending section bent relative to the second extension section, the second extension section of the second rail and the first wall section of the third rail are able to support each other.

14. The slide rail assembly of claim 11, further comprises a first bracket arranged on the first rail, one of the first bracket and the first rail comprises a first supporting portion, the first supporting portion is configured to provide at least one support of the first wall of the second rail in a transverse direction.

* * * * *